US009953926B2

United States Patent
Yu et al.

(10) Patent No.: US 9,953,926 B2
(45) Date of Patent: Apr. 24, 2018

(54) METHODS OF DEPOSITING COBALT MANGANESE FILMS

(71) Applicant: Applied Materials, Inc., Santa Clara, CA (US)

(72) Inventors: Sang Ho Yu, Cupertino, CA (US); Paul F. Ma, Santa Clara, CA (US); Jiang Lu, Milpitas, CA (US); Ben-Li Sheu, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/592,170

(22) Filed: Jan. 8, 2015

(65) Prior Publication Data

US 2015/0194384 A1 Jul. 9, 2015

Related U.S. Application Data

(60) Provisional application No. 61/925,034, filed on Jan. 8, 2014.

(51) Int. Cl.
| | |
|---|---|
| *H01L 21/4763* | (2006.01) |
| *H01L 21/44* | (2006.01) |
| *H01L 23/532* | (2006.01) |
| *H01L 21/768* | (2006.01) |
| *H01L 21/285* | (2006.01) |
| *C23C 16/34* | (2006.01) |
| *C23C 16/455* | (2006.01) |

(52) U.S. Cl.
CPC ........ *H01L 23/53238* (2013.01); *C23C 16/34* (2013.01); *C23C 16/45536* (2013.01); *H01L 21/28562* (2013.01); *H01L 21/76843* (2013.01); *H01L 23/53223* (2013.01); *H01L 2924/0002* (2013.01)

(58) Field of Classification Search
CPC ......... H01L 23/53238; H01L 23/53223; H01L 21/76843; H01L 21/76877; H01L 2924/0002; H01L 21/76841; H01L 21/28562; H01L 23/53252; H01L 23/53266; H01L 28/75; H01L 29/4933; H01L 29/4941; H01L 33/0037; H01L 41/0815
USPC ........................................ 438/627, 643, 653
See application file for complete search history.

(56) References Cited

U.S. PATENT DOCUMENTS

| | | | |
|---|---|---|---|
| 4,965,656 | A | 10/1990 | Koubuchi et al. |
| 7,514,353 | B2 | 4/2009 | Weidman et al. |
| 8,053,861 | B2 | 11/2011 | Mountsier et al. |

(Continued)

FOREIGN PATENT DOCUMENTS

KR 10-2013-0060432 6/2013

OTHER PUBLICATIONS

PCT ISR & Written Opinion in PCT/US2015/010592, dated Apr. 17, 2015, 12 pgs.

(Continued)

*Primary Examiner* — Kimberly Rizkallah
*Assistant Examiner* — Dilinh Nguyen
(74) *Attorney, Agent, or Firm* — Servilla Whitney LLC

(57) ABSTRACT

Described are semiconductor devices and methods of making semiconductor devices with a barrier layer comprising cobalt and manganese nitride. Also described are semiconductor devices and methods of making same with a barrier layer comprising CoMn(N) and, optionally, an adhesion layer.

9 Claims, 2 Drawing Sheets

(56) References Cited

U.S. PATENT DOCUMENTS

| | | |
|---|---|---|
| 8,188,599 B2 | 5/2012 | Koike |
| 8,324,730 B2 | 12/2012 | Koike et al. |
| 8,580,688 B2 | 11/2013 | Koike et al. |
| 8,653,663 B2 | 2/2014 | Kao et al. |
| 8,828,870 B2 | 9/2014 | Cabral, Jr. et al. |
| 2009/0253260 A1 | 10/2009 | Koike |
| 2011/0151661 A1 | 6/2011 | Sunayama et al. |
| 2013/0134494 A1 | 5/2013 | Hong et al. |
| 2013/0270702 A1 | 10/2013 | Yu et al. |
| 2013/0273733 A1* | 10/2013 | Tang ................ H01L 21/76843 438/643 |
| 2013/0277842 A1 | 10/2013 | Baumann et al. |
| 2013/0292806 A1 | 11/2013 | Ma et al. |

OTHER PUBLICATIONS

PCT International Preliminary Report on Patentability dated Jul. 21, 2016, 9 pages.

\* cited by examiner

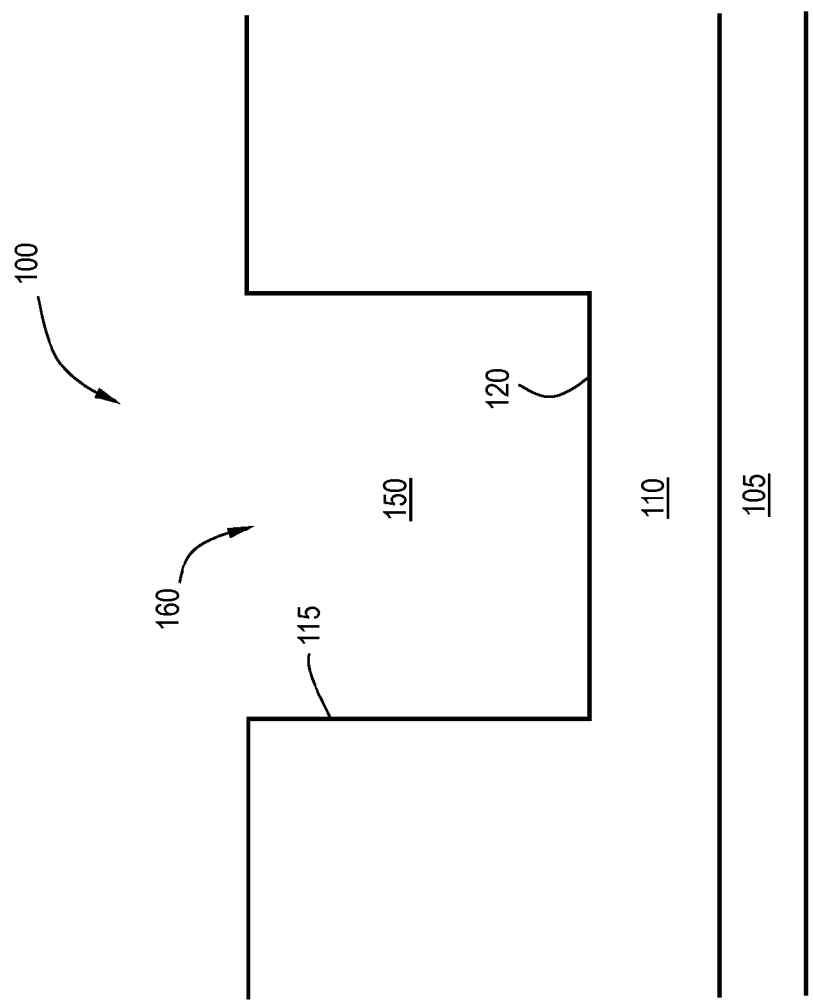

METHODS OF DEPOSITING COBALT MANGANESE FILMS

CROSS-REFERENCE TO RELATED APPLICATIONS

This application claims priority to U.S. Provisional Application No. 61/925,034, filed Jan. 8, 2014, the entire disclosure of which is hereby incorporated by reference herein.

FIELD

Embodiments of the present disclosure relate generally to barrier layers in semiconductor devices, and methods of forming such barrier layers. More particularly, embodiments of the disclosure relate to films comprising cobalt, manganese, cobalt and manganese and cobalt manganese nitrides ($MnN_x$).

BACKGROUND

Microelectronic devices, such as semiconductors or integrated circuits, can include millions of electronic circuit devices such as transistors, capacitors, etc. To further increase the density of devices found on integrated circuits, even smaller feature sizes are desired. To achieve these smaller feature sizes, the size of conductive lines, vias, interconnects, gates, etc., must be reduced. Reliable formation of multilevel interconnect structures is also necessary to increase circuit density and quality. Advances in fabrication techniques have enabled use of copper for conductive lines, interconnects, vias, and other structures. However, electromigration in interconnect structures becomes a greater hurdle to overcome, with decreased feature size and the increased use of copper for interconnections.

With the continued shrinking of critical dimensions, the need for a single layer barrier/liner for back end of line interconnect is necessary. Traditionally, a deposition of the barrier followed by a liner has been used extensively in the BEOL in the form of TaN/Ta and TaN/Co. However, the use of a multilayer approach is becoming ineffective as the feature sizes of the interconnects are becoming too small to allow for multiple layers. Therefore, there is a need in the art for single layer barrier films using a deposition technique that can conformally coat a high aspect ratio small feature trench or hole.

SUMMARY

One or more embodiments of the disclosure are directed to semiconductor devices comprising a substrate having a dielectric deposited thereon. The dielectric comprises at least one feature formed therein. The feature has at least one sidewall. A barrier layer comprising cobalt and manganese nitride is disposed on the dielectric and forms a substantially conformal film. A fill layer is on the barrier layer.

Additional embodiments of the disclosure are directed to methods of forming a semiconductor device. A substrate is provided with a dielectric layer disposed thereon, where the dielectric layer has a feature with at least one sidewall. A barrier layer is formed on the dielectric layer. The barrier layer comprises cobalt and manganese nitride. A fill layer is deposited over the barrier layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 1A and 1B illustrate a dielectric layer before and after deposition of a barrier layer and conductive fill material in accordance with one or more embodiments of the disclosure.

DETAILED DESCRIPTION

Figure 1B:
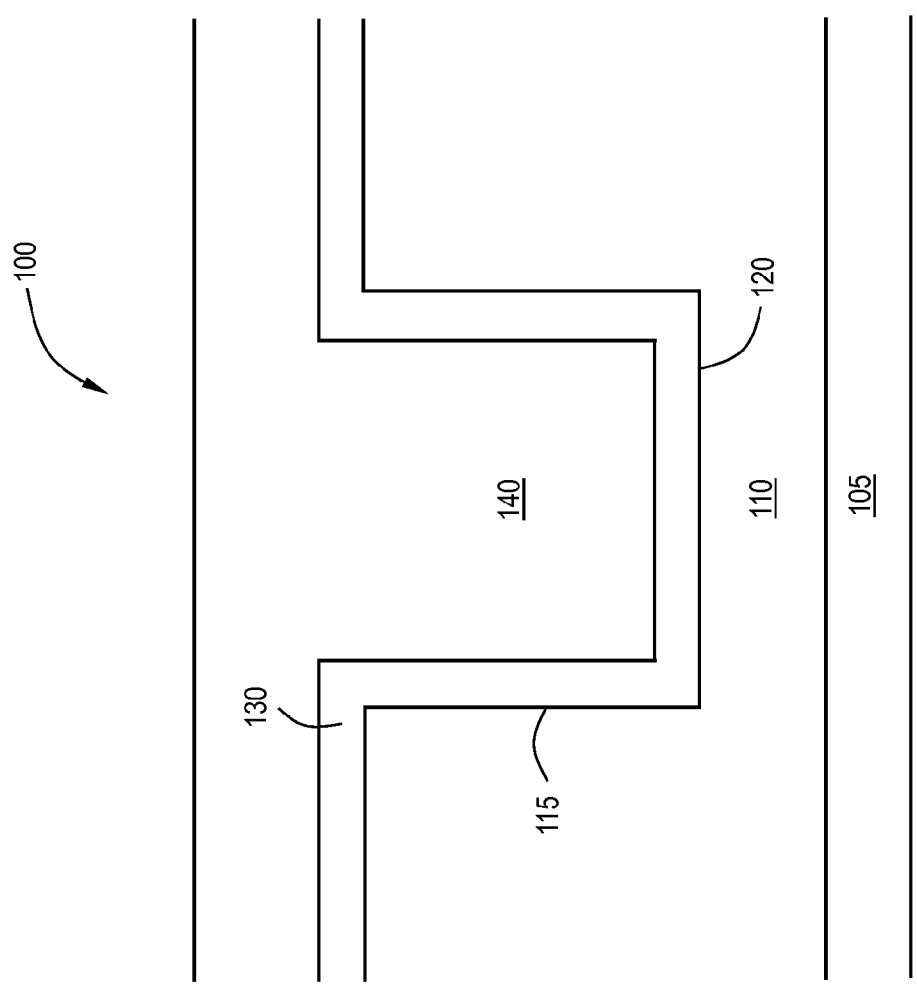

Before describing several exemplary embodiments of the disclosure, it is to be understood that the disclosure is not limited to the details of construction or process steps set forth in the following description. The disclosure is capable of other embodiments and of being practiced or being carried out in various ways Manganese may form an excellent barrier in the form of silicates and/or oxides. Cobalt may act as a good wetting layer for copper. The inventors have found that the combination of the two elements in a single layer CoMn(N) can be performed. The deposition of either metal or metal nitride is disclosed using either CVD or ALD techniques.

Embodiments of the disclosure are related to the deposition of CoMn(N) which can be achieved using a dual ampoule CVD/ALD chamber by co-flowing the precursors. The deposition can be done either simultaneously, as in a CVD type reaction, or cyclically, as in an ALD type reaction. Once deposited, without being bound by any particular theory of operation, it is believed that the Mn within the CoMn(N) film will form either a silicate or an oxide with the dielectric. There is a strong driving force for $MnO_x$ formation and this will lead to self-segregation of the Mn to the oxide interface within the CoMn(N). The segregation of the Mn will leave a Co rich interface with the subsequent Cu fill leading to an excellent adhesion at the interface. Alternatively, the CoMn(N) intermixing and/or reaction will lead to a single film that is both a copper and oxygen barrier and an excellent wetting layer for copper. The Co/Mn ratio within the film can be controlled by the amount of precursor flow in a CVD reaction and by the amount of exposure time in an ALD type reaction. The control of this ratio can allow for the adjustment of the barrier and wetting property of this binary film.

One aspect of the disclosure relates to a microelectronic device comprising a substrate, a dielectric layer, a barrier layer, and a conductive material. FIG. 1A depicts an embodiment of a microelectronic device 100 comprising a substrate 105 and a dielectric layer 110. The dielectric layer 110 is disposed upon the substrate 105, and the dielectric layer 110 has a trench 150 defined by a trench bottom 120, sidewalls 115, and opening 160.

In one or more embodiments, the dielectric layer 110 is a low-k dielectric layer. In some embodiments, the dielectric layer comprises $SiO_x$. Further embodiments provide that the dielectric layer comprises porous carbon-doped $SiO_x$. In one or more embodiments, the dielectric layer is a porous carbon-doped $SiO_x$ layer with a k value less than 3.

FIG. 1B shows the same microelectronic device 100 after deposition of a barrier layer 130, which covers at least a portion of the sidewall 115 and/or trench bottom 120. As shown in FIG. 1B, the barrier layer 130 may cover the entirety of the sidewall 115 and trench bottom 120.

The barrier layer 130 is disposed on the dielectric layer 110 and comprises cobalt and manganese nitride. The cobalt and manganese nitride layers can be deposited by any suitable techniques. For example, the film can be deposited by atomic layer deposition or chemical vapor deposition or a combination of techniques. The cobalt and manganese can be deposited at the same time or in layers. In some embodiments, the CoMn(N) layer is deposited by chemical vapor deposition in which the cobalt precursor, manganese precursor and nitriding agent are coflowed into the processing chamber and allowed to react in the gas phase and deposit onto the surface of the dielectric. The cobalt and manganese layers can also be deposited separately with each deposited by a chemical vapor deposition reaction. As used in this specification and the appended claims the composition of CoMn(N) can be any mixture of cobalt, manganese, cobalt nitride and manganese nitride.

In other embodiments, the cobalt and manganese nitrides are deposited in discrete layers by atomic layer deposition. In atomic layer deposition type chambers, the substrate can be exposed to the first and second precursors either spatially or temporally separated processes. Time-domain ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa.

In some embodiments, a layer of cobalt can be deposited by exposing the substrate to a cobalt precursor followed by a reducing agent and then a layer of manganese can be deposited by exposing the substrate containing the cobalt layer to a manganese precursor followed by a reducing agent (e.g., a nitriding agent). The inventors have found that Mn atoms can diffuse to low K oxides to form Mn(N)SiOx or/and Mn(N)O, of which embedded Mn(N)SiOx/Mn(N)Ox oxides are good oxygen & copper barriers. In one or more embodiments, a layer of manganese can be deposited by exposing the substrate to a manganese precursor followed by a reducing agent (e.g., a nitriding agent) and then a layer of cobalt can be deposited by exposing the substrate containing the manganese layer to a cobalt precursor followed by a reducing agent (e.g., a nitriding agent). The elements in the final film can migrate to the most energetically favorable positions within the layer after deposition. When depositing the layers separately, the cobalt layer can be deposited first or second. In some embodiments, the cobalt layer is the first layer deposited onto the dielectric followed by the manganese layer.

In some embodiments, either of the cobalt layer and the manganese layer can be deposited by atomic layer deposition and the other layer deposited by chemical vapor deposition. The depositions can occur in the same processing chamber or separate processing chambers.

The inventors have discovered that a CoMn(N) barrier layer can be significantly thinner than a traditional manganese barrier layer while retaining its wetting ability and barrier properties. In some embodiments, the thickness of the barrier layer is less than about 25 Å, or less than about 20 Å, or less than about 15 Å. In some embodiments, the thickness of the barrier layer is in the range of about 10 Å to about 25 Å, or in the range of about 10 Å to about 20 Å, or in the range of about 10 Å to about 15 Å. In some embodiments, the barrier layer is about 10 Å thick.

The ratio of cobalt to manganese in the barrier layer can affect the properties of the barrier layer including the wetting properties and barrier properties. The ratio may be adjusted depending on the specific dielectric layer it is being deposited on and/or the specific fill layer being deposited on the barrier layer. In some embodiments, the cobalt to manganese ratio, on an atomic basis, is in the range of about 1:5 to about 5:1, or in the range of about 1:4 to about 4:1, or in the range of about 1:3 to about 3:1, or in the range of about 1:1 to about 3:1 or about 2:1.

In one or more embodiments, the barrier layer comprises 0.1 to 10% dopant, based on the weight of the barrier layer. In some embodiments, the barrier layer comprises 0.2 to 8 wt. % dopant. In particular embodiments, the barrier layer comprises 0.5 to 5 wt. % dopant.

In some embodiments, the barrier layer is substantially free of copper. As used in this specification and the appended claims, the term "substantially free of copper" means that the copper content is less than about 5 wt. %, 4 wt. %, 3 wt. %, 2 wt. % or 1 wt. %. Additionally, copper is not intentionally added to the barrier layer in an amount greater than about 5 wt. %, 4 wt. %, 3 wt. %, 2 wt. % or 1 wt. %. It will be understood by those skilled in the art that a layer that is substantially free of copper may have a copper content that results from copper diffusing from an adjacent layer. Those skilled in the art understand that the copper content might change depending on, for example, oxide types, density, porosity, pore size, etc., and that substantially free of copper means that the copper content is minimized without any copper related leakage issues.

A conductive fill material 140 fills at least a portion of the trench 150 lined with barrier layer 130. According to one or more embodiments, the conductive fill material comprises copper or a copper alloy. In other embodiments, the conductive fill material further comprises Al.

The barrier layer 130 according to some embodiments of the disclosure allows for the direct contact of the fill material 140 without the need for an intervening adhesion layer. However, although the conductive fill material 140 in FIG. 1B is shown in direct contact with the barrier layer 130, intermediate layers may be incorporated in between the conductive fill material 140 and the barrier layer 130, such as adhesion layers or seeding layers to enhance the adhesion properties. According to one or more embodiments, the microelectronic device further comprises an adhesion layer comprising one or more of Ru and Co, Mn. In addition to Ru and/or Co, the adhesion layer may comprise one or more dopants such as Ta, Al, Mg, Cr, Nb, Ti or V.

In some embodiments, a seeding layer is deposited on top of the barrier layer. According to one or more embodiments, the seeding layer comprises an alloy of copper, such as a Cu—Mn alloy. In some embodiments, the seeding layer comprises less than about 5 wt. % Mn, less than about 4 wt. % Mn, less than about 3 wt. % Mn, or less than about 2 wt. % Mn. In one or more embodiments, the seeding layer comprises about 1 wt. % Mn. The line resistance of copper alloys containing 1 wt. % Mn is expected to be the same as or similar to the line resistance of pure copper.

In some embodiments, the barrier layer comprises $MnN_x$. The x of some embodiments is in the range of about 0.1 to about 3, or in the range of about 0.2 to about 2, or in the range of about 0.25 to about 1. In some embodiments, the film comprises manganese silicate and may be formed on the dielectric layer. In one or more embodiments, the manganese film comprises manganese silicate near the dielectric surface and manganese nitride further from the surface. The transition from the silicate to the nitride can be gradual or in discrete steps.

In some embodiments, the barrier layer is continuous at a thickness less than about 20 Å. As used in this specification and the appended claims, the term "continuous" means that there are no gaps in the film greater than about 10% of the total film area. In some embodiments, the film is continuous at a thickness less than 30 Å, 25 Å, 15 Å or 10 Å.

In addition to the films described above, another aspect of the disclosure relates to a method for forming interconnections in a microelectronic device comprising providing a substrate with a dielectric layer disposed thereon, depositing a barrier layer upon the dielectric layer, and depositing a conductive material upon the barrier layer. According to one or more embodiments of this aspect, the barrier layer comprises manganese nitride and a dopant selected from Ta, Al, Mg, Cr, Nb, Ti and V.

The films in accordance with various embodiments of this disclosure can be deposited over virtually any substrate material. A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates may have various dimensions, such as 200 mm or 300 mm diameter wafers, as well as, rectangular or square panes. Substrates on which embodiments of the disclosure may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and exposed to the deposition gases at different positions.

The co-reactants are typically in vapor or gas form. The reactants may be delivered with a carrier gas. A carrier gas, a purge gas, a deposition gas, or other process gas may contain nitrogen, hydrogen, argon, neon, helium, or combinations thereof. The various plasmas described herein, such as the nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, as described above, the gases can flow simultaneously through gas supply nozzle or head and the substrate and/or the gas supply head can be moved so that the substrate is sequentially exposed to the gases.

In another embodiment, a manganese-containing film may be formed during plasma enhanced atomic layer deposition (PEALD) process that provides sequential pulses of precursors and plasma. In specific embodiments, the co-reactant may involve a plasma. In other embodiments involving the use of plasma, during the plasma step the reagents are generally ionized during the process, though this might occur only upstream of the deposition chamber such that ions or other energetic or light emitting species are not in direct contact with the depositing film, this configuration often termed a remote plasma. Thus in this type of PEALD process, the plasma is generated external from the processing chamber, such as by a remote plasma generator system. During PEALD processes, a plasma may be generated from a microwave (MW) frequency generator or a radio frequency (RF) generator. Although plasmas may be used during the deposition processes disclosed herein, it should be noted that plasmas are not required. Indeed, other embodiments relate to deposition processes under very mild conditions without a plasma.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a semiconductor device, the method comprising:
   providing a substrate comprising a dielectric layer disposed thereon, the dielectric layer having a feature with at least one sidewall; and
   forming a barrier layer on the dielectric layer, the barrier layer comprising cobalt and manganese nitride with a cobalt:manganese ratio of about 2:1 on an atomic basis, the barrier layer being continuous at a thickness of about 15 Å; and
   depositing a fill layer over the barrier layer without an intervening adhesion layer or seeding layer, the fill layer comprising copper, wherein the barrier layer is substantially free of copper.

2. The method of claim 1, wherein the barrier layer is formed by chemical vapor deposition of cobalt and manganese nitride at about the same time.

3. The method of claim 1, wherein the barrier layer is formed by sequentially depositing a layer of cobalt and a layer of manganese nitride.

4. The method of claim 3, wherein the cobalt layer and manganese nitride layers are deposited by atomic layer deposition.

5. The method of claim 3, wherein one of the cobalt layer and the manganese layer are deposited by atomic layer deposition and the other is deposited by chemical vapor deposition.

6. The method of claim 1, wherein the barrier layer has a thickness of less than about 25 Å.

7. The method of claim 1, wherein the barrier layer has a thickness of about 10 Å.

8. The method of claim 1, wherein the fill layer comprises one or more of copper and aluminum.

9. The method of claim 1, wherein the barrier layer further comprises a dopant.

* * * * *